United States Patent [19]

Dove

[11] Patent Number: 5,736,784
[45] Date of Patent: Apr. 7, 1998

[54] VARIABLE-WIDTH LEAD INTERCONNECTION STRUCTURE AND METHOD

[75] Inventor: Lewis R. Dove, Monument, Colo.

[73] Assignee: Hewlett-Packard Co., Palo Alto, Calif.

[21] Appl. No.: 740,595

[22] Filed: Oct. 31, 1996

[51] Int. Cl.$^6$ ................................................ H01L 23/48
[52] U.S. Cl. ................................. 257/692; 257/735
[58] Field of Search ................................. 257/692, 735, 257/734, 693, 694

[56] References Cited

FOREIGN PATENT DOCUMENTS

| 3190270 | 8/1981 | Japan | 257/692 |
| 1315167 | 12/1989 | Japan | 257/692 |

Primary Examiner—Jerome Jackson
Assistant Examiner—Nathan K. Kelley
Attorney, Agent, or Firm—Patrick J. Murphy

[57] ABSTRACT

A variable-width lead interconnection structure disposed between a printed circuit board and a multichip module is presented. An edge clip with leads having a widened middle section is provided to optimize manufacturability and electrical performance. Each lead has a characteristic width and spacing of conventional leads where the leads are soldered to a multichip module or PCB. However, in between each end, each lead has a middle section that is widened to provide a characteristic impedance closer to the ideal 50 ohms, thus producing structures with better return loss at high frequencies.

3 Claims, 2 Drawing Sheets

VARIABLE-WIDTH LEAD INTERCONNECTION STRUCTURE AND METHOD

FIELD OF THE INVENTION

The present invention relates generally to circuit interconnections and more particularly to a variable-width lead interconnection structure disposed between a printed circuit board and a multichip module.

BACKGROUND OF THE INVENTION

In the design and manufacture of high-speed digital circuits that involve at least two different circuit platforms, the electrical interconnection between circuits is of great concern. Interconnections which do not match the characteristic impedance of the circuit result in signal reflections and, thus, loss of power transmission and signal integrity. For high-speed digital circuits, the required bandwidth for interconnections can be related to the rise time of the digital pulse by the following formula: $BW=0.35 \text{ N}/t_r$; where tr is the digital pulse rise time and N is the highest order frequency harmonic to be passed. Values of N=3 to 5 are typically used to estimate an adequate interconnect bandwidth for digital pulse integrity. With pulse rise times now below 500 picoseconds in many high-speed digital designs, it is imperative to design digital circuit interconnects with microwave bandwidths.

High frequency hybrid circuits can be fabricated on an insulating substrate comprised of an alumina or similar ceramic. The hybrid circuit combines any number of thick- or thin-film components, semiconductor devices and discrete parts such as capacitors. Hybrid circuits are employed in high frequency and microwave applications, although low frequency applications can also be implemented. In many cases, an insulated lid is attached to the substrate encapsulating the circuitry.

Electronic devices, particularly hybrid circuits, that are mounted onto printed circuit boards (PCB), need to provide a large number of input/output (I/O) signals as well as provide a surface mountable subsystem that is re-workable for test and field replacement. Typically, edge clips with fine pitch leads are employed to mount the hybrid circuit to the PCB. Conventional edge clips have a pitch of 50 mils which is the minimum pitch that can be reliably soldered. A problem with this arrangement, however, is that the characteristic impedance of this structure in air is quite high, introducing discontinuities into the system. For example, simulation tests performed by the inventor on 20 mil wide clips with 30 mil spaces in between have shown characteristic impedances greater that 125 ohms. This impedance is much greater than the 50 ohms that is desired for most applications.

SUMMARY OF THE INVENTION

The present invention provides an edge clip with leads having a widened middle section. At the point where the leads are soldered to a multichip module or PCB, the lead width and spacing of conventional leads are preserved (e.g., 50 mils). However, in between each end, the leads are widened to provide a characteristic impedance closer to the ideal 50 ohms, thus producing structures with better return loss at high frequencies.

An edge clip structure is provided for interconnecting a substrate package and a printed circuit board. The structure comprises a plurality of leads, each lead having first and second ends, and a widened middle section disposed between the first and second ends. The width of the middle section is variable; that is, a plurality of widths may be used without departing from the scope of the present invention. In one preferred embodiment, the variable-width middle section is greater than 10 mils and less than 50 mils wide.

The present invention can also be viewed as a method comprising the steps of (i) applying solder paste on the conductive pads of the package substrate; (ii) placing the leads having variable-width middle sections onto the solder pads; (iii) reflowing the solder paste; (iv) applying solder paste to the conductive pads of the PCB; (v) placing the package, with the attached leads, onto the solder pads of the PCB; and (vi) reflowing the solder to provide the interface connections between the package leads and the PCB.

DETAILED DESCRIPTION OF THE PREFERRED EMBODIMENT

An edge clip with leads having a widened middle section is presented. Each lead has a characteristic width and spacing of conventional leads where the leads are soldered to a multichip module or PCB. However, in between each end, each lead has a middle section that is widened to provide a characteristic impedance closer to the ideal 50 ohms, thus producing structures with better return loss at high frequencies.

Figure 1:
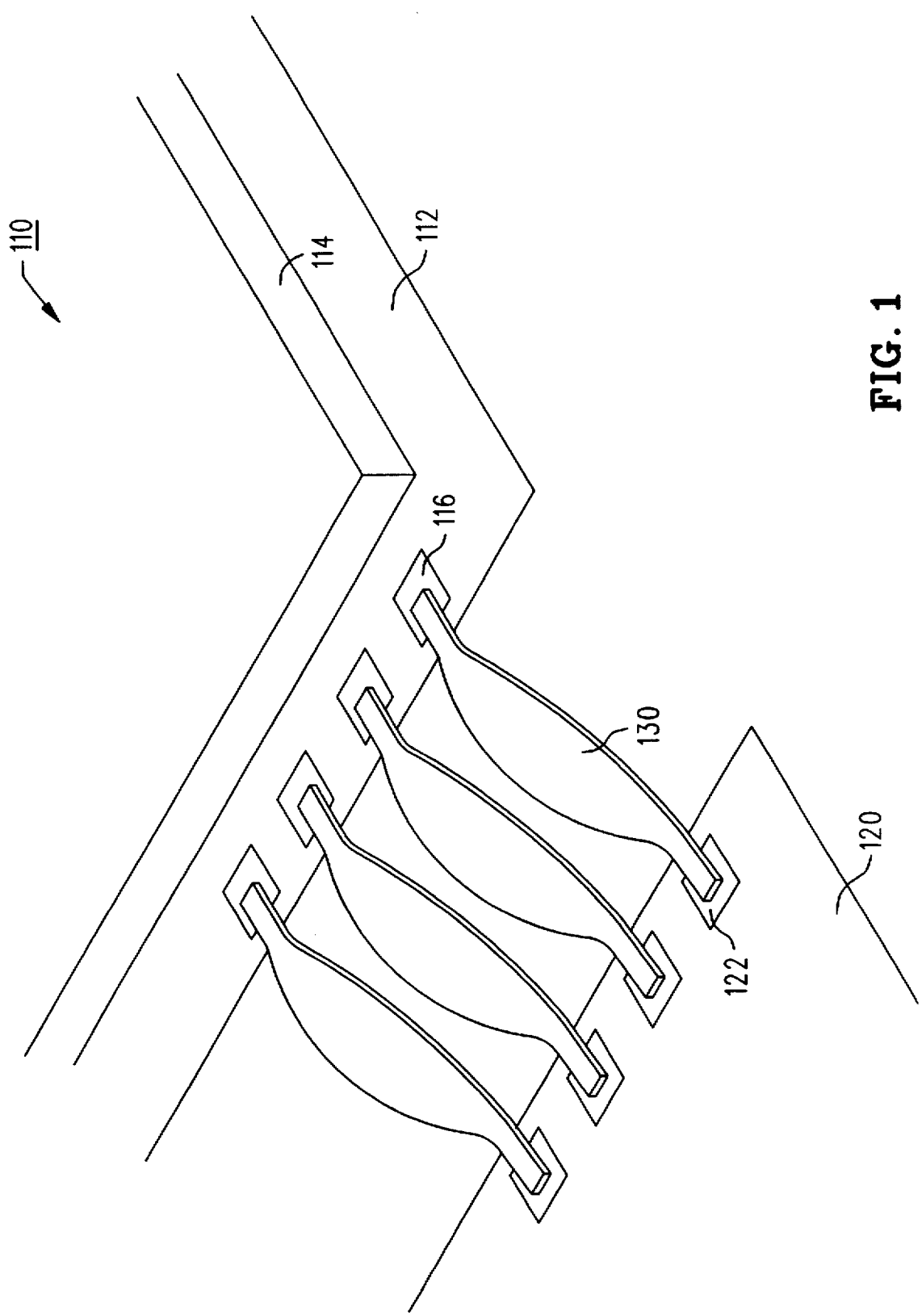
FIG. 1 shows a perspective view of a circuit substrate package connected to a printed circuit board (PCB) via an edge clip according to the present invention.

FIG. 1 shows a perspective view of a circuit substrate package connected to a printed circuit board (PCB) via an edge clip according to the present invention. A high frequency substrate package 110 is comprised of a customized microcircuit affixed to a customizable region (not shown) and is encased within an isolation lid 114, as well known in the art, which can be made of kovar for example. The lid 114 offers mechanical protection to the customized microcircuit, as well as electrical isolation and hermetic sealing. The substrate package 110 also comprises a high frequency substrate 112 which can be made of a ceramic composite such as alumina, for example. The customizable region can accommodate a variety of components such as thick-film, thin-film and co-fired ceramic circuitry. For example, thick-film components can be fabricated directly upon the customizable region. These thick-film components can then be either passively or actively trimmed to a wide range of values resulting in passive elements (e.g., resistors, inductors, capacitors). Active components such as bare silicon, or gallium arsenide, integrated circuits can be attached to the substrate 112 within the customizable region via wire, ribbon or mesh bonding. Surface mount components can be soldered to the customizable region directly. Indeed, customizable circuitry can utilize chip, wire and SMT assembly in any combination within the same customizable region.

The substrate package 110 is electrically coupled to a PCB 120 via an edge clip according to the present invention. Conductive land patterns 122 on the PCB 120 substantially match up with conductive land pattern pads 116 on the substrate 112. The edge clip comprises a plurality of leads 130, each of the leads have a first end electrically coupled to a land pattern 116 on the substrate 112 and a second end electrically coupled to a land pattern 122 on the PCB 120. A widened middle section is disposed between the first and second ends of the lead 130.

Figure 2:
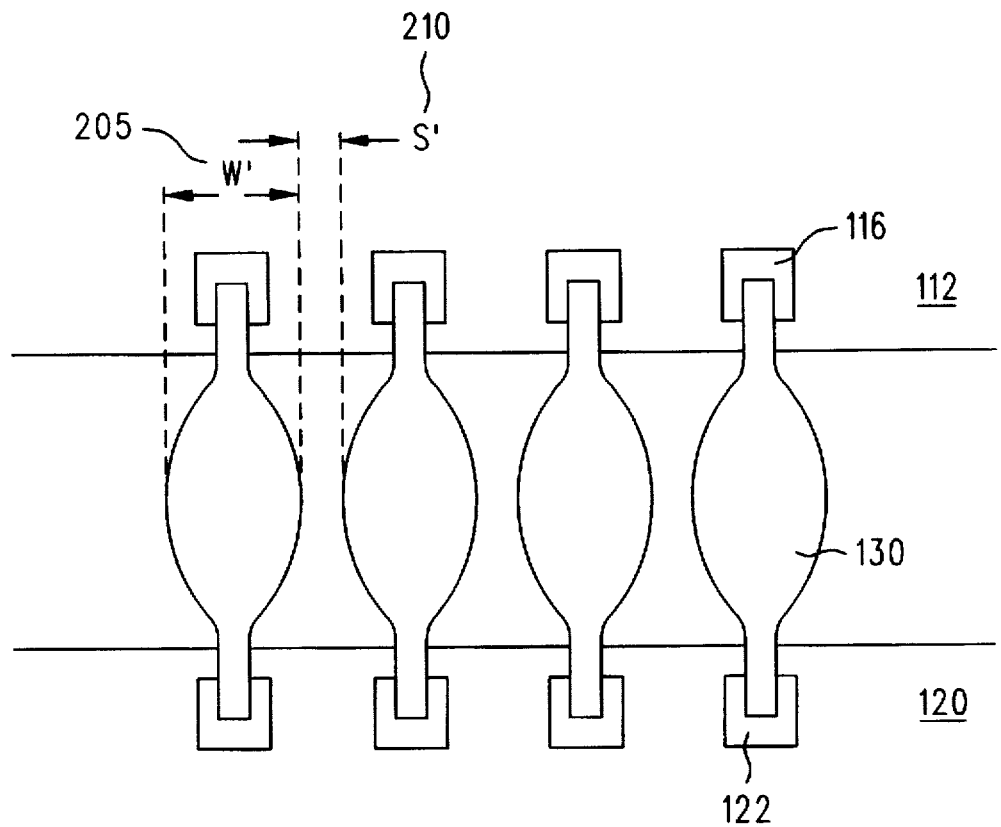
FIG. 2 shows a top view of the variable-width leads according to the present invention.
Figure 3:
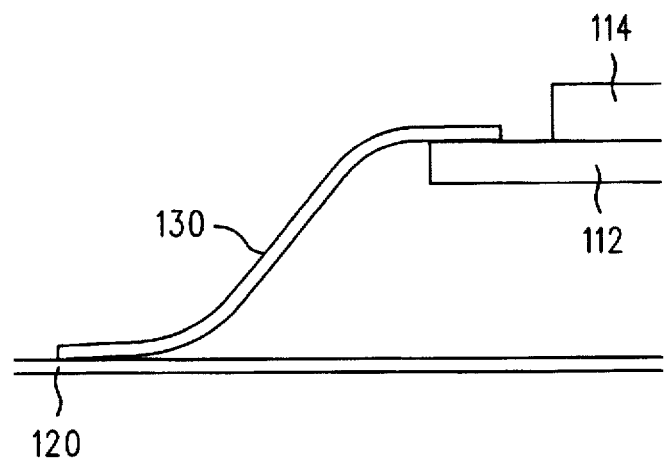
FIG. 3 shows a side view of the present invention.

FIG. 2 shows a top view of the variable-width leads according to the present invention; FIG. 3 shows a side view of the present invention in which the leads 130 are shaped into a gull wing configuration. Each lead 130 is electrically coupled to the substrate 112 and the PCB 120. The widened middle section has a characteristic width of w' 205, measured at substantially the middle point along the length of the lead 130. In a preferred embodiment, the widened middle section is gradually tapered to both the first and second ends to minimize signal reflection.

Spacing, s' 210, separates each of the leads 130. In one preferred embodiment, w' 205 is greater than 10 mils and less than 50 mils wide. In another preferred embodiment, w' 205 is 40 mils wide. In another embodiment, w' 205 is 45 mils wide. In simulation tests performed by the inventor, impedance values have been found to better mimic the ideal 50 ohms:

w'=40 mils, s'=10 mils; $Z_\phi$=78.8 ohms w'=45 mils, s'=5 mils; $Z_\phi$=56.7 ohms The leads 130 may be either stamped out or chemically etched using conventional manufacturing techniques.

By providing leads with a widened middle section, manufacturability and electrical performance are optimized. The usual lead width and spacing is provided at both ends, where the leads 130 are soldered to the substrate 112 and PCB 120. This preserves manufacturability (i.e., it is easier to solder the leads to the substrate and PCB when enough space is provided in between each lead). Additionally, maintaining the usual lead width and spacing obviates the problem of solder bridging that occurs in configurations where the lead pitch is smaller (e.g., 20 mils). With the middle section widened, electrical performance is optimized since the characteristic impedance is closer to 50 ohms. This improved characteristic impedance provides a better return loss ratio at high frequencies.

While the present invention has been illustrated and described in connection with the preferred embodiments, it is not to be limited to the particular structures and methods shown. It should be understood by those skilled in the art that various changes and modifications may be made within the purview of the appended claims without departing from the true scope and spirit of the invention in its broader aspects. For example, the concept of leads with widened middle sections could be applied to various types of surface mount leads (e.g., gull wing or "J" leads), to flat pack leads, or leads coming out of a metal package. The present invention could also be used on a multichip module, laminate or ceramic, or a single chip plastic package.

What is claimed is:

1. An edge clip structure for interconnecting a substrate package and a printed circuit board (PCB), the edge clip structure comprising:

a plurality of leads, each of the plurality of leads comprises a first end, a widened middle section, and a second end; and the widened middle section gradually tapers to both the first and second ends.

2. The edge clip structure of claim 1, wherein the widened middle section is greater than 10 mils and less than 50 mils wide.

3. The edge clip structure of claim 2, wherein the first end of each of the plurality of leads is electrically coupled to a substrate, and the second end of each of the plurality of leads is electrically coupled to a PCB.

* * * * *